(12) United States Patent
Kao (10) Patent No.: US 9,312,292 B2
(45) Date of Patent: Apr. 12, 2016

(54) BACK SIDE ILLUMINATION IMAGE SENSOR AND MANUFACTURING METHOD THEREOF

(75) Inventor: Ching-Hung Kao, Hsinchu County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 387 days.

(21) Appl. No.: 13/282,441

(22) Filed: Oct. 26, 2011

(65) Prior Publication Data

US 2013/0105926 A1    May 2, 2013

(51) Int. Cl.
*H01L 27/14* (2006.01)
*H01L 31/0232* (2014.01)
*H01L 27/146* (2006.01)

(52) U.S. Cl.
CPC ...... *H01L 27/14621* (2013.01); *H01L 27/1464* (2013.01); *H01L 27/14687* (2013.01)

(58) Field of Classification Search
CPC .. H01L 27/1464; H01L 31/0232; H01L 27/14
USPC .......................... 257/432, 431; 438/70, 69, 57
See application file for complete search history.

(56) References Cited

U.S. PATENT DOCUMENTS

| | | |
|---|---|---|
| 3,930,295 A | 1/1976 | Rose |
| 4,148,048 A | 4/1979 | Takemoto |
| 4,460,912 A | 7/1984 | Takeshita |
| 4,533,624 A | 8/1985 | Sheppard |
| 4,644,172 A | 2/1987 | Sandland |
| 4,745,451 A | 5/1988 | Webb |
| 4,951,104 A | 8/1990 | Kato |
| 5,070,380 A | 12/1991 | Erhardt |
| 5,241,417 A | 8/1993 | Sekiguchi |
| 5,246,803 A | 9/1993 | Hanrahan |
| 5,294,288 A | 3/1994 | Melpolder |
| 5,321,297 A | 6/1994 | Enomoto |
| 5,466,926 A | 11/1995 | Sasano |
| 5,587,696 A | 12/1996 | Su |
| 5,625,210 A | 4/1997 | Lee |
| 5,650,864 A | 7/1997 | Tseng |
| 5,830,624 A | 11/1998 | Bae |
| 5,880,495 A | 3/1999 | Chen |
| 5,977,535 A | 11/1999 | Rostoker |
| 6,006,764 A | 12/1999 | Chu |
| 6,071,826 A | 6/2000 | Cho |
| 6,081,018 A | 6/2000 | Nakashiba |

(Continued)

OTHER PUBLICATIONS

Wuu et al., "A Leading-Edge 0.9 um Pixel CMOS Image Sensor Technology with Backside Illumination: Future Challenges for Pixel Scaling (Invited)", 2010.

*Primary Examiner* — Evan Pert
*Assistant Examiner* — Damon Hillman
(74) *Attorney, Agent, or Firm* — Winston Hsu; Scott Margo (57) ABSTRACT

A manufacturing method of a BSI image sensor includes providing a substrate having a plurality of photo-sensing elements and a plurality of multilevel interconnects formed on a first side of the substrate; forming a redistribution layer (RDL) and a first insulating layer covering the RDL on the front side of the substrate; providing a carrier wafer formed on the front side of the substrate; forming a color filter array (CFA) on a second side of the substrate, the second side being opposite to the first side; removing the carrier wafer; and forming a first opening in the first insulating layer for exposing the RDL.

8 Claims, 8 Drawing Sheets

(56) References Cited

U.S. PATENT DOCUMENTS

| | | | |
|---|---|---|---|
| 6,087,211 A | 7/2000 | Kalnitsky | |
| 6,124,200 A | 9/2000 | Wang | |
| 6,294,313 B1 | 9/2001 | Kobayashi | |
| 6,297,160 B1 | 10/2001 | Chien | |
| 6,338,976 B1 | 1/2002 | Huang | |
| 6,352,876 B1 | 3/2002 | Bordogna | |
| 6,369,417 B1 | 4/2002 | Lee | |
| 6,376,797 B1 | 4/2002 | Piwczyk | |
| 6,388,278 B1 | 5/2002 | Suzuki | |
| 6,407,415 B2 | 6/2002 | Lee | |
| 6,433,844 B2 | 8/2002 | Li | |
| 6,482,669 B1 | 11/2002 | Fan | |
| 6,514,810 B1 | 2/2003 | Kim | |
| 6,566,151 B2 | 5/2003 | Yeh | |
| 6,617,189 B1 | 9/2003 | Chen | |
| 6,632,700 B1 | 10/2003 | Fan | |
| 6,641,464 B1 | 11/2003 | Steere, III | |
| 6,664,191 B1 | 12/2003 | Kim | |
| 6,730,555 B2 | 5/2004 | Kim | |
| 6,794,215 B2 | 9/2004 | Park | |
| 6,821,809 B2 | 11/2004 | Abe | |
| 6,841,848 B2 | 1/2005 | MacNamara | |
| 6,846,722 B2 | 1/2005 | Lee | |
| 6,849,533 B2 | 2/2005 | Chang | |
| 6,872,584 B2 | 3/2005 | Nakashiba | |
| 6,921,934 B2 | 7/2005 | Patrick | |
| 6,933,972 B2 | 8/2005 | Suzuki | |
| 6,953,608 B2 | 10/2005 | Leu | |
| 6,960,512 B2 | 11/2005 | Cheng | |
| 7,006,294 B2 | 2/2006 | Steenblik | |
| 7,078,779 B2 | 7/2006 | Wang | |
| 7,115,924 B1 | 10/2006 | LaMaster | |
| 7,129,172 B2 | 10/2006 | Morrow | |
| 7,180,044 B2 | 2/2007 | Yu | |
| 7,199,439 B2 | 4/2007 | Farnworth | |
| 7,229,745 B2 | 6/2007 | Lamarre | |
| 7,315,359 B2 | 1/2008 | Hong | |
| 7,328,915 B2 | 2/2008 | Smith | |
| 7,498,190 B2 | 3/2009 | Kao | |
| 7,648,851 B2 | 1/2010 | Fu | |
| 7,659,595 B2 * | 2/2010 | Shiau et al. | 257/459 |
| 8,502,335 B2 * | 8/2013 | Tseng | H01L 24/05 257/447 |
| 8,697,473 B2 * | 4/2014 | Borthakur | H01L 27/14621 257/228 |
| 2001/0023086 A1 | 9/2001 | Park | |
| 2003/0227079 A1 * | 12/2003 | Chia et al. | 257/723 |
| 2004/0122328 A1 | 6/2004 | Wang | |
| 2005/0024520 A1 | 2/2005 | Yamamoto | |
| 2005/0103983 A1 | 5/2005 | Yamaguchi | |
| 2005/0121599 A1 | 6/2005 | Mouli | |
| 2005/0186739 A1 | 8/2005 | Wang | |
| 2005/0247963 A1 | 11/2005 | Chen | |
| 2005/0274988 A1 | 12/2005 | Hong | |
| 2005/0274996 A1 | 12/2005 | Iwawaki | |
| 2006/0054946 A1 | 3/2006 | Baek | |
| 2006/0124833 A1 | 6/2006 | Toda | |
| 2006/0146230 A1 | 7/2006 | Joon | |
| 2006/0146412 A1 | 7/2006 | Kim | |
| 2006/0172451 A1 | 8/2006 | Park | |
| 2006/0183265 A1 | 8/2006 | Oh | |
| 2006/0231898 A1 | 10/2006 | Jeong | |
| 2007/0010042 A1 | 1/2007 | Li | |
| 2007/0012970 A1 | 1/2007 | Mouli | |
| 2007/0018073 A1 | 1/2007 | Hsu | |
| 2007/0023851 A1 | 2/2007 | Hartzell | |
| 2007/0031988 A1 | 2/2007 | Agranov | |
| 2007/0052050 A1 | 3/2007 | Dierickx | |
| 2007/0072326 A1 | 3/2007 | Zheng | |
| 2007/0096173 A1 | 5/2007 | Kim | |
| 2007/0117253 A1 | 5/2007 | Hsu | |
| 2007/0158772 A1 | 7/2007 | Boettiger | |
| 2007/0166649 A1 | 7/2007 | Yu | |
| 2007/0202696 A1 | 8/2007 | Inuiya | |
| 2008/0036020 A1 | 2/2008 | Ko | |
| 2008/0055733 A1 | 3/2008 | Lim | |
| 2008/0079103 A1 | 4/2008 | Liao | |
| 2008/0121805 A1 | 5/2008 | Tweet | |
| 2008/0121951 A1 | 5/2008 | Kao | |
| 2008/0157144 A1 | 7/2008 | Lee | |
| 2008/0169546 A1 | 7/2008 | Kwon | |
| 2008/0265348 A1 | 10/2008 | Maas | |
| 2009/0066954 A1 | 3/2009 | Opsal | |
| 2009/0121264 A1 | 5/2009 | Kao | |
| 2009/0124037 A1 | 5/2009 | Yu | |
| 2009/0127643 A1 | 5/2009 | Lu | |
| 2009/0134484 A1 | 5/2009 | Lin | |
| 2009/0168181 A1 | 7/2009 | Su | |
| 2009/0200585 A1 | 8/2009 | Nozaki | |
| 2009/0212335 A1 | 8/2009 | Kao | |
| 2009/0224343 A1 * | 9/2009 | Akram | H01L 27/1464 257/432 |
| 2009/0256258 A1 | 10/2009 | Kreupl | |
| 2009/0294888 A1 | 12/2009 | Tsai | |
| 2009/0321862 A1 | 12/2009 | Yu | |
| 2010/0003623 A1 | 1/2010 | Liu | |
| 2010/0038688 A1 | 2/2010 | Wu | |
| 2010/0044813 A1 | 2/2010 | Wu | |
| 2010/0096359 A1 | 4/2010 | Shiu | |
| 2010/0144156 A1 | 6/2010 | Shih | |
| 2010/0159632 A1 | 6/2010 | Rhodes | |
| 2010/0315734 A1 | 12/2010 | Wu | |
| 2011/0057277 A1 | 3/2011 | Yu | |
| 2011/0180892 A1 * | 7/2011 | Jang et al. | 257/432 |
| 2012/0146153 A1 * | 6/2012 | Wen | H01L 21/6835 257/368 |
| 2013/0037910 A1 * | 2/2013 | Tzeng et al. | 257/532 |

\* cited by examiner

BACK SIDE ILLUMINATION IMAGE SENSOR AND MANUFACTURING METHOD THEREOF

BACKGROUND OF THE INVENTION

1. Field of the Invention

The present invention generally relates to an image sensor and a manufacturing method thereof, and more particularly, to a back side illumination (BSI) complementary metal oxide semiconductor (CMOS) image sensor and manufacturing method thereof.

2. Description of the Prior Art

CMOS image sensors (hereinafter abbreviated as CIS) are widely used in various applications such as digital camera. The CIS are used for sensing a volume of exposed light projected towards a semiconductor substrate. To do this, the CIS use an array of pixels, or image sensor elements, to collect photo energy to convert images into electrical signals that can be used in a suitable application. A CIS pixel includes a photodetector such as a photodiode, photogate detector, or phototransistor, to collect photo energy.

Figure 1:
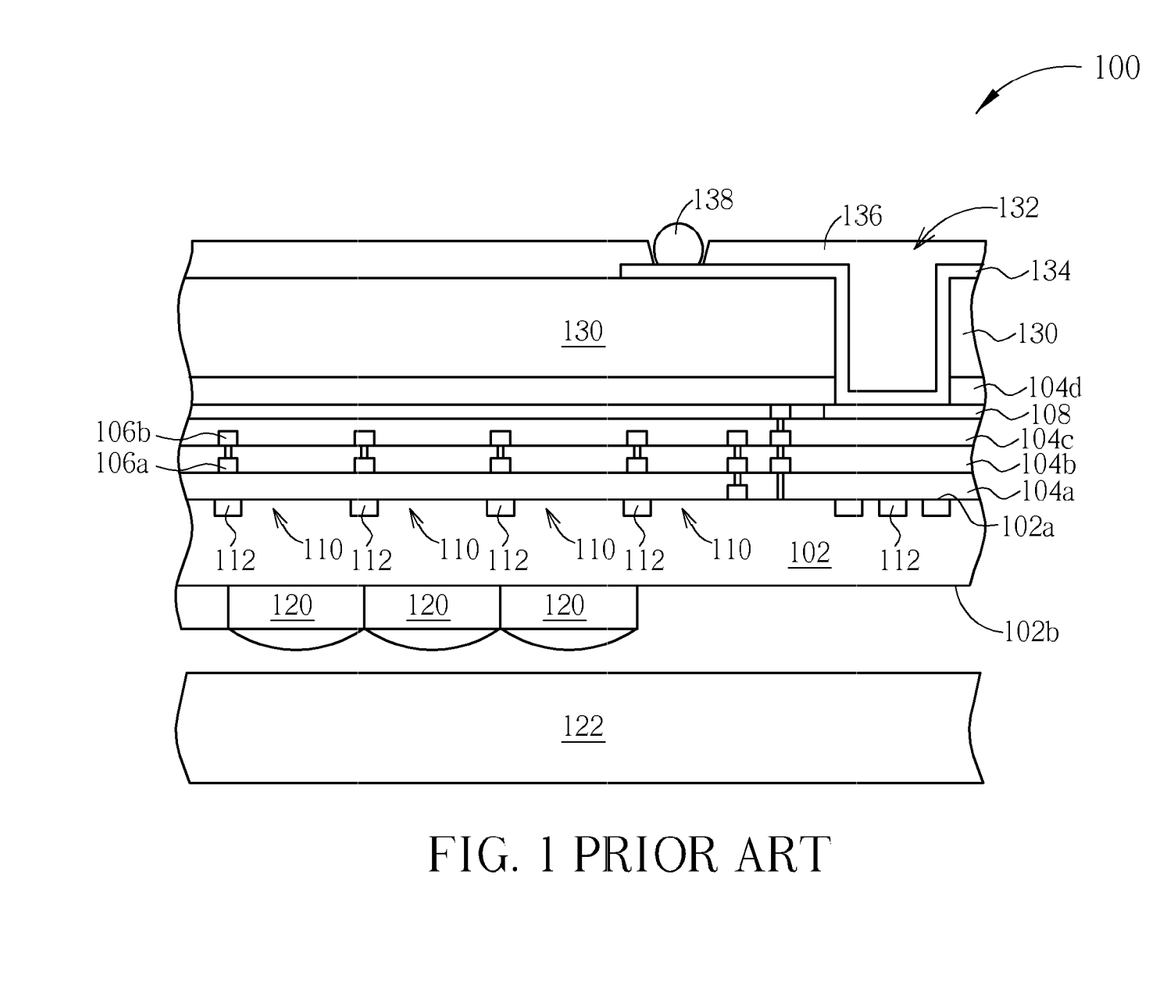
FIG. 1 is a schematic drawing illustrating a conventional BSI CIS.

One form of CIS, backside-illuminated (BSI) CIS, sense a volume of light projected towards the back side surface of the substrate of the sensor by using pixels located on the front side of the substrate. Please refer to FIG. 1, which is a schematic drawing illustrating a conventional BSI CIS 100. As shown in FIG. 1, the conventional BSI CIS 100 includes a thinned silicon substrate 102 having a plurality of photodiode regions 110. The photodiode regions 110 are electrically isolated from each other by a plurality of shallow trench isolations (STIs) 112. The conventional BSI CIS 100 also includes a plurality of dielectric layers 104a, 104b, 104c and 104d, by which a plurality of metal layers 106a, 106b are respectively sandwiched therebetween, formed on the silicon substrate 102. Said dielectric layers and the metal layers construct the multilevel interconnects as shown in FIG. 1. For simplifying the features of the conventional BSI CIS 100, all the transistor devices are omitted. The conventional BSI CIS 100 is photosensitive to light incident upon the back side 102b of the silicon substrate 102, therefore the conventional BSI CIS 100 further includes a color filter array (CFA) 120 respectively corresponding to the photodiode regions 110 formed on the back side 102b of the silicon substrate 102. And a glass 122 is subsequently formed on the back side 102b of the silicon substrate 102.

The BSI CIS 100 is advantageous in that they provide higher fill factor and reduced destructive interference. However, the silicon substrate 102 must be thin enough that light projected towards the back side 102b of the silicon substrate 102 can reach the pixels. Therefore, a silicon carrier wafer 130 is always in need to provide support for the thinned silicon substrate 102. As shown in FIG. 1, the silicon carrier wafer 130 is bonded to the front side 102a of the silicon substrate 102 before forming the CFA 120. For providing output electrical connection for the BSI CIS 100, a through-silicon via (TSV) 132 is formed to penetrate the silicon carrier wafer 130 and thus expose a bonding pad 108 after forming the CFA 120. Then, a redistribution layer 134, a passivation layer 136, and a solder ball 138 are formed as shown FIG. 1. Additionally, the silicon carrier wafer 130 is sandwiched between the insulating layer 104d and the passivation layer 136 as shown in FIG. 1.

It is noteworthy that the conventional BSI CIS 100 always faces a requirement of low thermal budget due to the CFA 120 formed on the back side 102b of the silicon substrate 100. In detail, while the CFA 120 lowers the thermal budget to 200° C.-250° C., the temperatures for forming the passivation layer 130, the RDL 134, and the solder ball 138 are all higher than 250° C. It is found that the CFA 120 suffers damages after forming the above mentioned elements. Furthermore, the TSV technique, which forms to penetrate the silicon carrier wafer 130, also complicates the process.

Briefly speaking, though the BSI CIS 100 has the advantages of higher fill factor and reduced destructive interference, it still has more problems in process integration and process control. As such, an improved BSI CIS and manufacturing method thereof is desired.

SUMMARY OF THE INVENTION

According to an aspect of the present invention, a manufacturing method of a BSI image sensor is provided. The manufacturing method includes providing a substrate having a plurality of photo-sensing elements and a plurality of multilevel interconnects formed on a first side of the substrate; forming a redistribution layer (RDL) and a first insulating layer covering the RDL on the first side of the substrate; providing a carrier wafer formed on the first side of the substrate; forming a color filter array (CFA) on a second side of the substrate, the second side being opposite to the first side; removing the carrier wafer; and forming a first opening in the first insulating layer for exposing the RDL.

According to another aspect of the present invention, a BSI image sensor is provided. The BSI image sensor includes a substrate having a front side and a back side, a first insulating layer formed on the front side of the substrate, a second insulating layer formed directly on the first insulating layer, a first opening formed in the first insulating layer, and a redistribution layer (RDL) formed in the first opening. Furthermore, sidewalls of the first opening are surrounded by the first insulating layer.

According to the present invention, elements formed at process temperatures higher than the thermal budget of the CFA are all fabricated before forming the CFA, therefore those temperatures render no impact to the CFA. Consequently, the CFA of the BSI image sensor provided by the present invention never suffers damages from high temperatures. Secondly, since the carrier wafer is removed from the substrate, no TSV technique is required, therefore the process is simplified.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating a manufacturing method for a BSI image sensor provided by a preferred embodiment of the present invention, wherein

DETAILED DESCRIPTION

Figure 2:
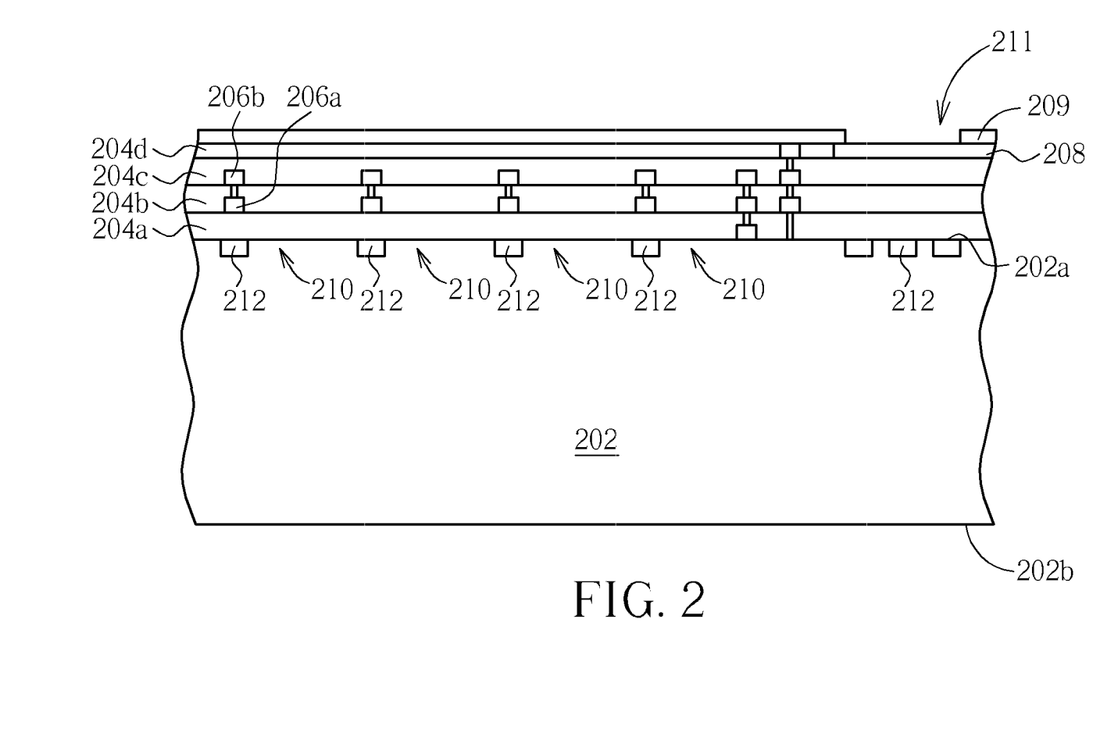

Please refer to FIGS. 2-8, which are schematic drawings illustrating a manufacturing method for a BSI image sensor provided by a preferred embodiment of the present invention. As shown in FIG. 2, the preferred embodiment first provides a substrate 202. The substrate 202 has a first side 202a and a second side 202b opposite to the first side 202a. For example, the first side 202a is the front side of the substrate 202 and the second side 202b is the back side of the substrate 202. The substrate 202 includes a plurality of photo-sensing elements 210, such as photodiode regions, which are electrically isolated from each other by shallow trench isolations (STIs) 212. A plurality of dielectric layers 204a, 204b, 204c and 204d, by which a plurality of metal layers 206a, 206b are respectively sandwiched therebetween, is formed on the substrate 202. Said dielectric layers and the metal layers construct a plurality of multilevel interconnects. A bonding pad 208 is formed on the topmost dielectric layer 204d and covered by an insulating layer 209. Please note that all the transistor devices of the BSI image sensor are omitted, but those skilled in the art should not ignore those elements. Furthermore, the photo-sensing elements 210 and the multilevel interconnects are all formed in the front side 202a of the substrate 202.

Please still refer to FIG. 2. Then an opening 211 is formed in the insulating layer 209 and the opening 211 exposes a portion of the bonding pad 208. It is noteworthy that sidewalls of the opening 211 are only surrounded by the insulating layer 209.

Figure 3:
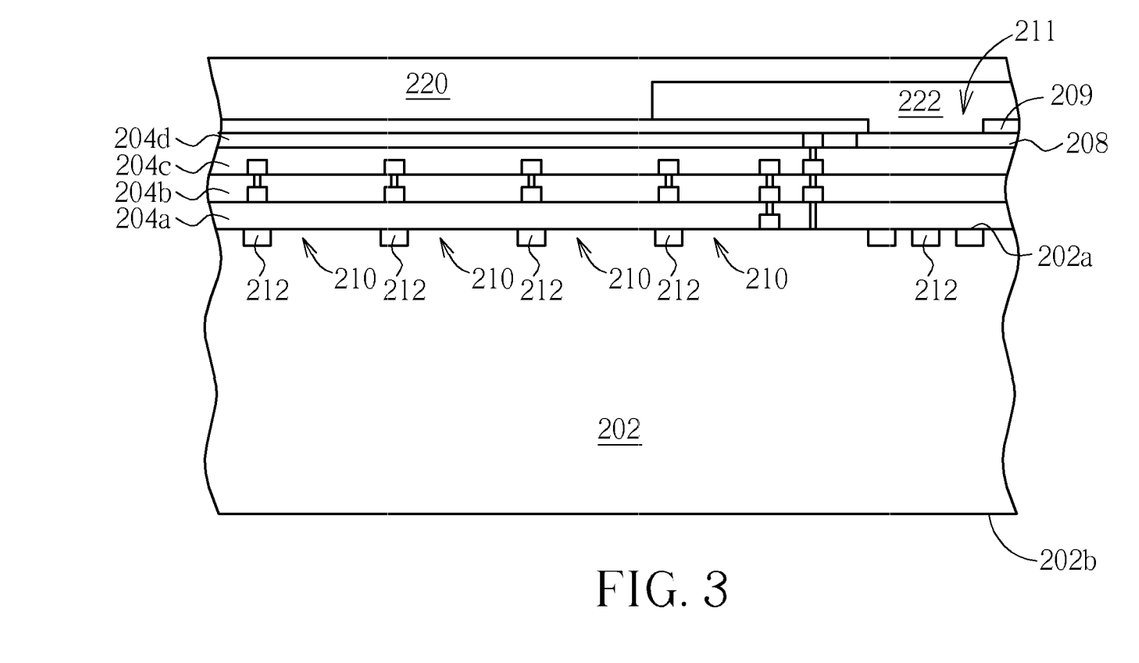
FIG. 3 is a schematic drawing in a step subsequent to FIG. 2.

Please refer to FIG. 3. After forming the opening 211, a redistribution layer (RDL) 222 is formed on the front side 202a of the substrate 202 and followed by forming another insulating layer 220, such as a passivation layer directly on the insulating layer 209 and the RDL 222. As shown in FIG. 3, the RDL 222 is formed in the opening 211 and electrically connected to the bonding pad 208 through the opening 211. The RDL 222 and the insulating layer 220 are formed at temperatures higher than 250° C. It is noteworthy that the insulating layer 220 is formed to cover the RDL 222 entirely. Therefore, a thickness of the insulating layer 220 is larger than a thickness of the RDL 222. The insulating layer 220 having the desired thickness can be formed by conventional film formation methods. And a planarization process can be performed to thin down the insulating layer 220 if required.

Figure 4:
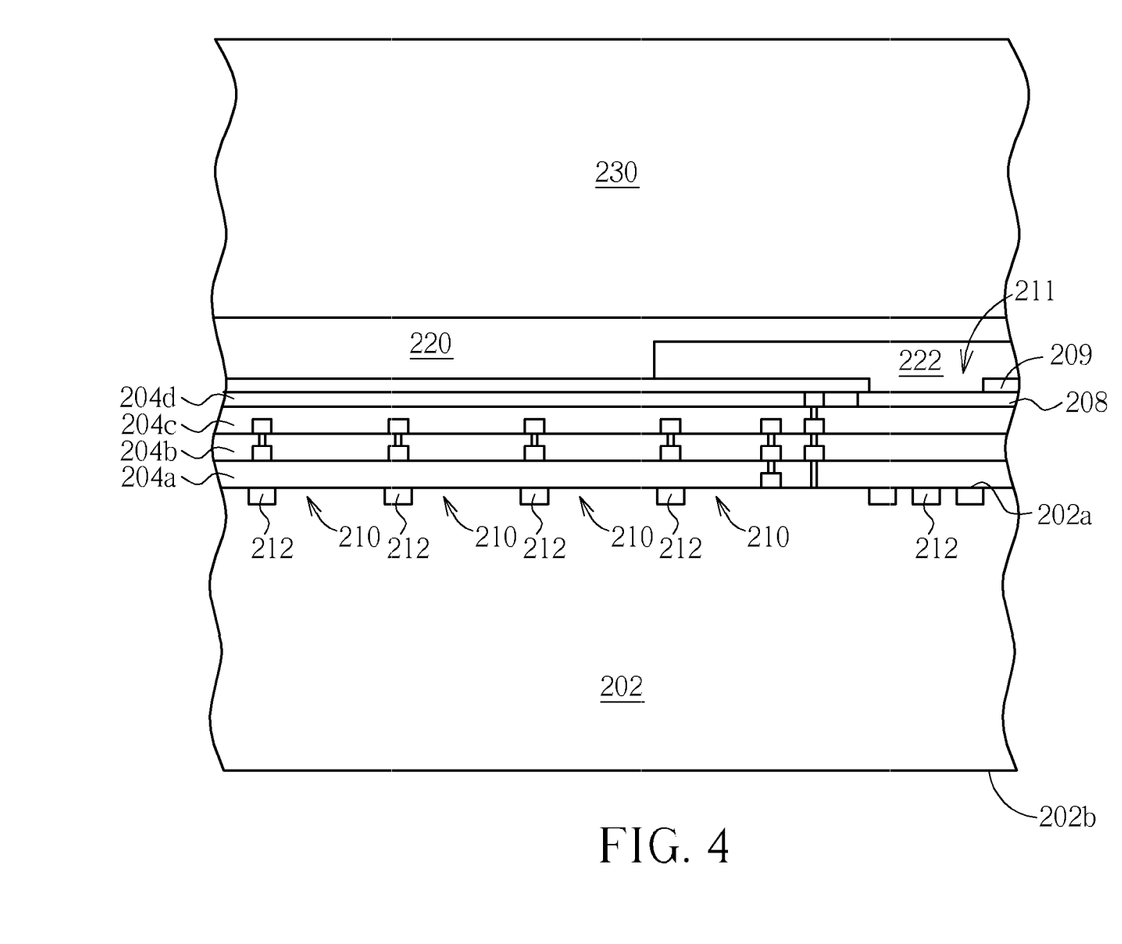
FIG. 4 is a schematic drawing in a step subsequent to FIG. 3.

Please refer to FIG. 4. Subsequently, a carrier wafer 230 is provided and formed on the front side 202a of the substrate 202. Specifically speaking, the carrier wafer 230 is formed on the insulating layer 220. The carrier wafer 230 is bonded to the insulating layer 220 by commonly used bonding materials (not shown), such as a photoresist, epoxy, or UV tape, but is not limited to those materials.

Figure 5:
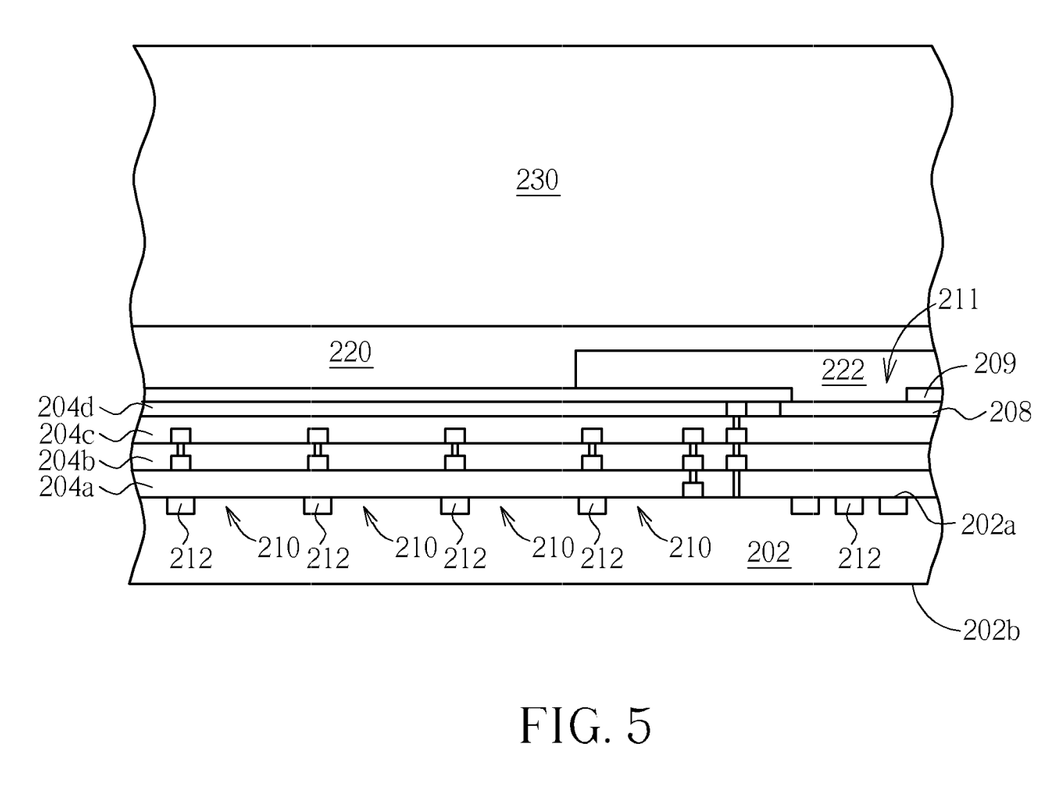
FIG. 5 is a schematic drawing in a step subsequent to FIG. 4.

Please refer to FIG. 5. After bonding the carrier wafer 230 to the substrate 202, a wafer thinning process is performing to the substrate 202. The wafer thinning process includes a grinding process, a polishing process, a plasma etching process, a wet etching process, or any combinations of the above processes. Because the substrate 202 must be thin enough that light projected towards the back side 202b of the substrate 202 can reach the photo-sensing elements 210 formed in the front side 202a, the substrate 202 is thinned from the back side 202b. Accordingly, the substrate 202 includes a reduced thickness after the wafer thinning process, and the reduced thickness is between 1.8 micrometer (µm) and 3 µm. It is well-known that the thinned substrate 202 is very fragile; therefore the carrier wafer 230 provides support to the thinned substrate 202.

Figure 6:
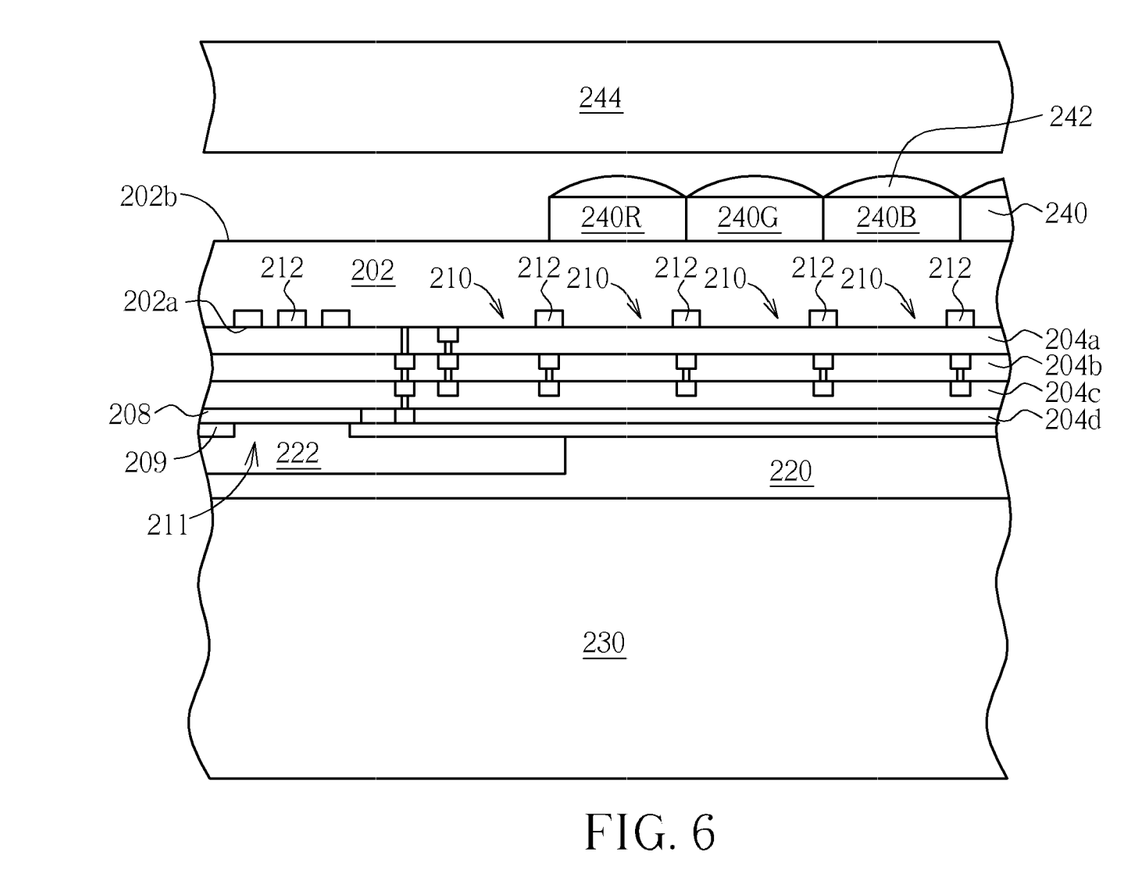
FIG. 6 is a schematic drawing in a step subsequent to FIG. 5.

Please refer to FIG. 6. After the wafer thinning process, the substrate 202 is flipped and a color filter array (CFA) 240 is formed on the back side (that is the second side) 202b of the substrate 202. The CFA 240 includes a plurality of color filters 240R/240G/240B, and as shown in FIG. 6, each color filer 240R/240G/240B is formed respectively corresponding to a photodiode region 210. Subsequently, microlens 242 respectively corresponding to the color filters 240R/240G/240B are formed on the CFA 240. Then, a transparent protecting member, for example but not limited to a glass substrate 244, is formed on the back side 202b of the substrate as shown in FIG. 6.

Figure 7:
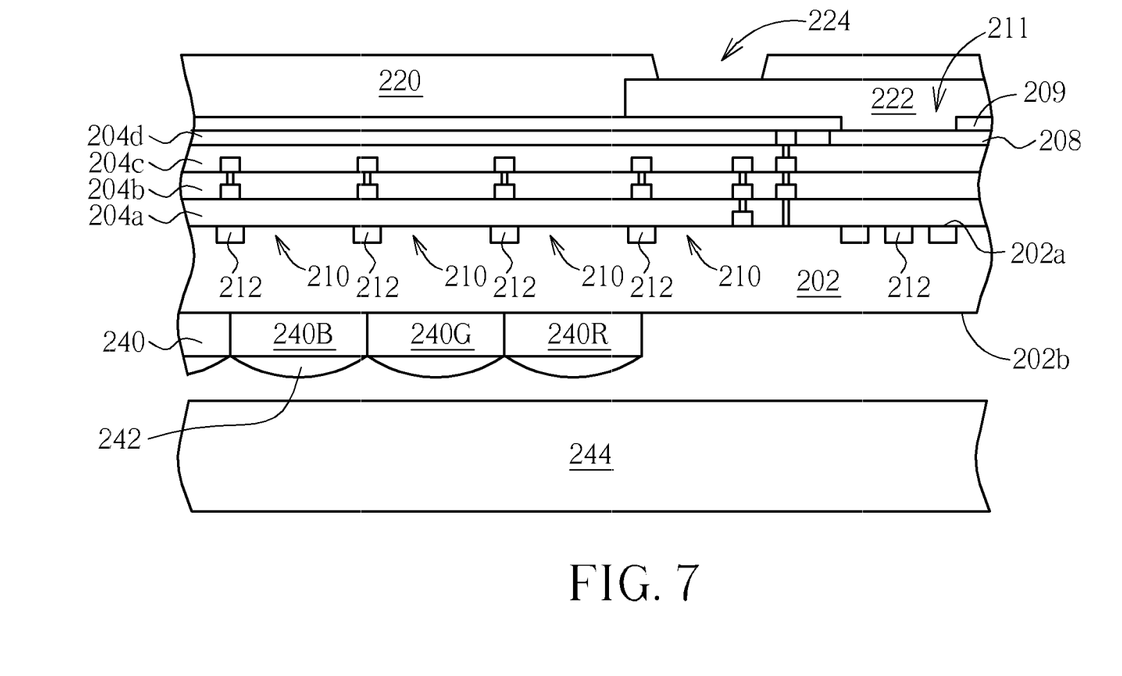
FIG. 7 is a schematic drawing in a step subsequent to FIG. 6.

Please refer to FIG. 7. Next, the substrate 202 is flipped back and followed by removing the carrier wafer 230 from the front side (that is the first side) 202a. After removing the carrier wafer 230, an opening 224 is formed in the insulating layer 220. It should be noted that the opening 224 is formed to expose the RDL 222. More important, the opening 224 and the opening 211 are spaced apart from each other.

Figure 8:
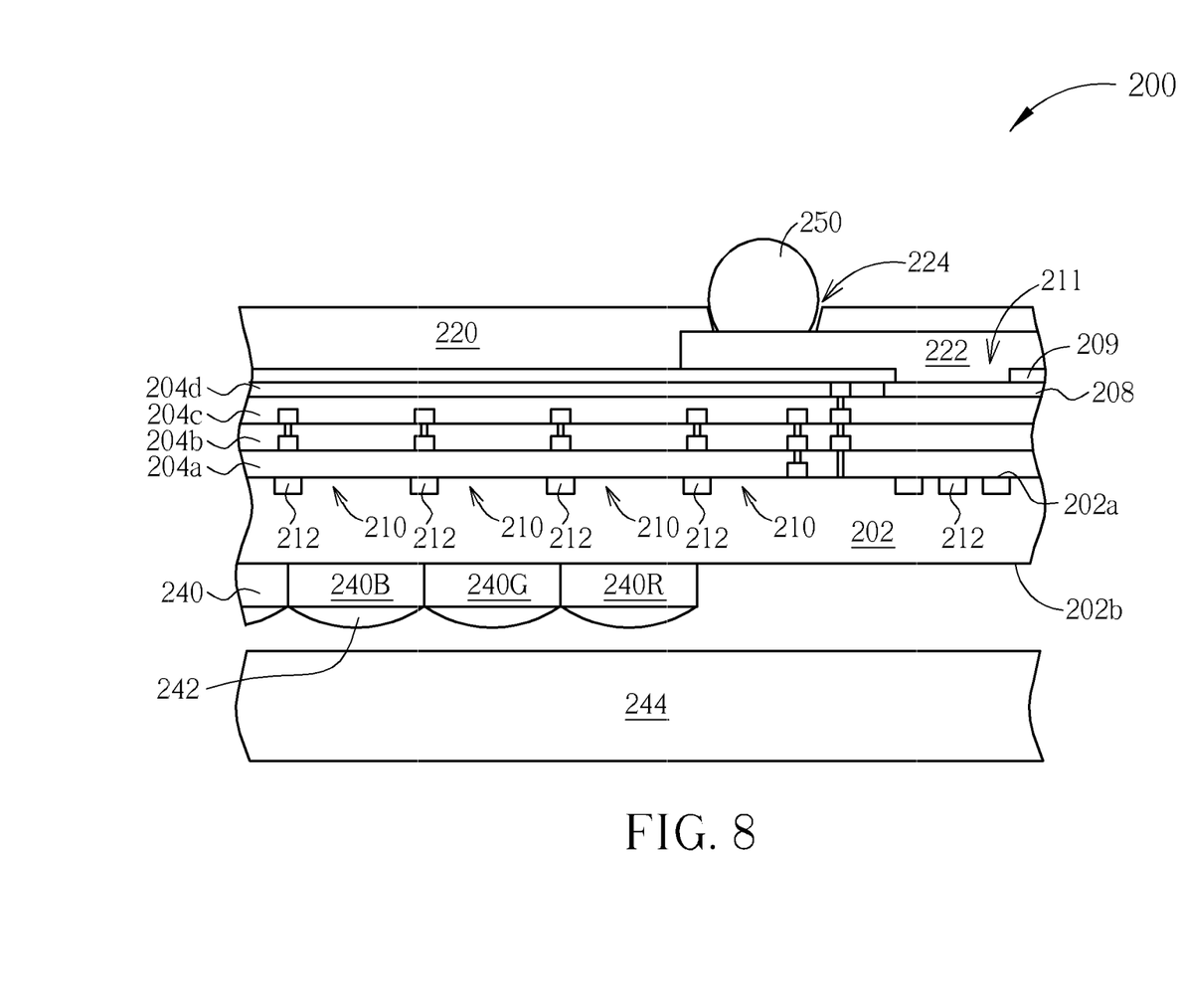
FIG. 8 is a schematic drawing in a step subsequent to FIG. 7.

Please refer to FIG. 8. After forming the opening 224, a conductive structure 250, such as a solder ball, electrically connected to the RDL 222 is formed in the opening 224. Consequently, a BSI image sensor 200 is obtained.

According to the present invention, elements formed at process temperatures higher than the thermal budget of the CFA are all fabricated before forming the CFA, therefore those temperatures render no impact to the CFA. Consequently, the CFA of the BSI image sensor provided by the present invention never suffers damages from high temperatures. Secondly, since the carrier wafer is removed from the substrate, no TSV technique is required, therefore the process is simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a back side illumination (BSI) image sensor, comprising:
    providing a substrate having a plurality of photo-sensing elements and a plurality of multilevel interconnects formed on a first side of the substrate;
    forming a bonding pad and a first insulating layer covering the bonding pad on the first side of the substrate;
    forming a redistribution layer (RDL) and a second insulating layer covering the RDL on the first insulating layer, the RDL being electrically connected to the bonding pad;
    providing a carrier wafer formed on the first side of the substrate after forming the RDL and the second insulating layer;
    performing a wafer thinning process to a second side of the substrate after providing the carrier wafer, the second side being opposite to the first side;
    forming a color filter array (CFA) on the second side of the substrate after performing the wafer thinning process;
    removing the carrier wafer; and
    forming a second opening in the second insulating layer on the first side of the substrate for exposing the RDL after removing the carrier wafer.

2. The manufacturing method of a BSI image sensor according to claim 1, further comprising forming a first opening in the first insulating layer for exposing the bonding pad before forming the RDL.

3. The manufacturing method of a BSI image sensor according to claim 2, wherein the RDL electrically connected to the bonding pad through the first opening.

4. The manufacturing method of a BSI image sensor according to claim 2, wherein the first opening and the second opening are spaced apart from each other.

5. The manufacturing method of a BSI image sensor according to claim 1, further comprising performing a planarization process to the second insulating layer before providing the carrier wafer.

6. The manufacturing method of a BSI image sensor according to claim 1, wherein the substrate comprises a reduced thickness after the step of thinning the substrate, and the reduced thickness is between 1.8 micrometer (μm) and 3 μm.

7. The manufacturing method of a BSI image sensor according to claim 1, further comprising forming a protecting member on the CFA.

8. The manufacturing method of a BSI image sensor according to claim 1, further comprising forming a conductive structure electrically connected to the RDL in the second opening.

* * * * *